(12) United States Patent
Gilbert et al.

(10) Patent No.: US 7,555,691 B2
(45) Date of Patent: Jun. 30, 2009

(54) APPARATUS AND METHOD FOR PROVIDING NEAR-OPTIMAL REPRESENTATIONS OVER REDUNDANT DICTIONARIES

(75) Inventors: Anna C. Gilbert, Summit, NJ (US); Shanmugavelayutham Muthukrishnan, Washington, DC (US); Martin J. Struass, Summit, NJ (US)

(73) Assignee: AT&T Intellectual Property, II, L.P., Bedminster, NJ (US)

( * ) Notice: Subject to any disclaimer, the term of this patent is extended or adjusted under 35 U.S.C. 154(b) by 1355 days.

(21) Appl. No.: 10/851,586

(22) Filed: May 21, 2004

(65) Prior Publication Data
US 2004/0250207 A1 Dec. 9, 2004

Related U.S. Application Data

(60) Provisional application No. 60/472,614, filed on May 22, 2003.

(51) Int. Cl.
*G06F 11/00* (2006.01)
(52) U.S. Cl. .................. 714/746; 714/737; 708/530
(58) Field of Classification Search .................. None
See application file for complete search history.

(56) References Cited

U.S. PATENT DOCUMENTS 5,862,059 A * 1/1999 Matula et al. ............. 708/270
6,223,192 B1 * 4/2001 Oberman et al. ........... 708/270
6,353,818 B1 * 3/2002 Carino, Jr. ................ 707/2

OTHER PUBLICATIONS

Alon et al., "The Space Complexity of Approximating the Frequency Moments", Feb. 22, 2002, 10 page(s), US.
Candes, et al., "Ridgelets: Theory and Applications", Aug. 1, 1998, 125 page(s), Stanford University, US.
Chen, et al. "Atomic Decomposition by Basis Pursuit", Aug. 1, 1998, 29 page(s), Stanford University, US.
Coifman, et al. "Entropy-Based Algorithms for Best Basis Selection", Mar. 1, 1992, 5 page(s), IEEE Transactions on Information Theory, US.
Davis, et al. "Greedy Adaptive-Approximation", Jan. 1, 1997, 41 page(s), Springer-Verlag New York Inc., US.
Donoho, et al. "Beamlet Pyramids: A New Form of Multiresolution Analysis Suited for Extracting Lines, Curves and Objects from Very Noisy Image Data", Jul. 3, 2000, 12 page(s), Stanford University, US.
Donoho, "Wedgelets: Nearly-Minimax Estimation of Edges", Aug. 1, 1997, 35 page(s), Stanford University and U.C. Berkley, US.
Gilbert, et al. "Fast, Small-Space Algorithms for Approximate Histogram Maintenance", May 19, 2002, 10 page(s), STOC, US.

(Continued)

*Primary Examiner*—Christine T Tu
(74) *Attorney, Agent, or Firm*—Michael Haynes PLC; Michael N. Haynes (57) ABSTRACT

Certain exemplary embodiments provide a method comprising a plurality of activities, comprising: automatically: receiving a signal; and via a plurality of iterations, determining, for the received signal, a provable near-optimal B-term representation formed from a linear combination of a plurality of elements selected from a predetermined redundant μ-coherent dictionary, said determined near-optimal B-term representation corresponding to an error that is a minimum of a set of errors corresponding to all possible B-term representations associated with the predetermined redundant μ-coherent dictionary.

18 Claims, 3 Drawing Sheets

OTHER PUBLICATIONS

Gilbert, et al. "Near-Optimal Sparse Fourier Representations Via Sampling", Jan. 1, 2002, 10 page(s), STOC, US.

Indyk, et al. "Approximate Nearest Neighbors: Towards Removing the Curse of Dimensionality", Jan. 1, 1998, 10 page(s), Stanford University, US.

Indyk, "High-Dimensional Computational Geometry", Sep. 1, 2000, 196 page(s), PhD Thesis, Stanford University, US.

Kushileviz, "Efficient Search for Approximate Nearest Neighbor in High Dimensional Spaces", Jan. 1, 1998, 10 page(s), STOC, US.

Mallat, et al. "Matching Pursuits with Time-Frequency Dictionaries", Dec. 1, 1993, 19 page(s), IEEE, US.

Nisan, et al. "Hardness vs. Randomness", Jan. 1, 1994, 20 page(s), Institute of Computer Science, Hebrew University of Jerusalem, Israel, US.

Pati, et al. "Orthogonal matching Pursuit: Recursive Function Approximation with Applications to Wavelet Decompostion", Jan. 1, 1993, 5 pages(s), IEEE, US.

Temlyakov, "Greedy Algorithims and m-term Approximation with Regard to Redundant Dictionaries", May 1, 1999, 29 page(s), Academic Press, US.

Temlyakov, "The Best m-term Approximation and Greedy Algorithms", Jan. 1, 1998, 17 page(s), J.C. Baltzer AG, Science Publishers, US.

Thiele, et al. "A Fast Algorithm for Adapted Time Frequency Tilings", Jan. 1, 1996, 9 page(s), Academic Press, US.

Villemoes, "Best Approximation with Walsh Atoms", Jan. 1, 1997, 27 page(s), Springer-Verlag New York, US.

Villemoes, "NonLinear Approximation with Walsh Atoms", Jan. 1, 1997, 8 page(s), Vanderbilt University Press, US.

\* cited by examiner

APPARATUS AND METHOD FOR PROVIDING NEAR-OPTIMAL REPRESENTATIONS OVER REDUNDANT DICTIONARIES

CROSS-REFERENCE TO RELATED APPLICATIONS

This application claims priority to, and incorporates by reference herein in its entirety, pending U.S. Provisional Patent Application Ser. No. 60/472,614, filed 22 May 2003.

SUMMARY

Certain exemplary embodiments provide a method comprising a plurality of activities, comprising: automatically: receiving a signal; and via a plurality of iterations, determining, for the received signal, a provable near-optimal B-term representation formed from a linear combination of a plurality of elements selected from a predetermined redundant μ-coherent dictionary, said determined near-optimal B-term representation corresponding to an error that is a minimum of a set of errors corresponding to all possible B-term representations associated with the predetermined redundant μ-coherent dictionary.

BRIEF DESCRIPTION OF THE DRAWINGS

A wide variety of potential embodiments will be more readily understood through the following detailed description, with reference to the accompanying drawings in which.

Definitions

When the following terms are used herein, the accompanying definitions apply:

automatically—acting or operating in a manner essentially independent of external influence or control. For example, an automatic light switch can turn on upon "seeing" a person in its view, without the person manually operating the light switch.

comprising—including but not limited to.

firmware—machine-readable instructions that are stored in a read-only memory (ROM). ROM's can comprise PROMs and EPROMs.

haptic—both the human sense of kinesthetic movement and the human sense of touch. Among the many potential haptic experiences are numerous sensations, body-positional differences in sensations, and time-based changes in sensations that are perceived at least partially in non-visual, non-audible, and non-olfactory manners, including the experiences of tactile touch (being touched), active touch, grasping, pressure, friction, traction, slip, stretch, force, torque, impact, puncture, vibration, motion, acceleration, jerk, pulse, orientation, limb position, gravity, texture, gap, recess, viscosity, pain, itch, moisture, temperature, thermal conductivity, and thermal capacity.

I/O device—any sensory-oriented input and/or output device, such as an audio, visual, haptic, olfactory, and/or taste-oriented device, including, for example, a monitor, display, projector, overhead display, keyboard, keypad, mouse, trackball, joystick, gamepad, wheel, touchpad, touch panel, pointing device, microphone, speaker, video camera, camera, scanner, printer, haptic device, vibrator, tactile simulator, and/or tactile pad, potentially including a port to which an I/O device can be attached or connected.

information device—any device capable of processing information, such as any general purpose and/or special purpose computer, such as a personal computer, workstation, server, minicomputer, mainframe, supercomputer, computer terminal, laptop, wearable computer, and/or Personal Digital Assistant (PDA), mobile terminal, Bluetooth device, communicator, "smart" phone (such as a Handspring Treo-like device), messaging service (e.g., Blackberry) receiver, pager, facsimile, cellular telephone, a traditional telephone, telephonic device, a programmed microprocessor or microcontroller and/or peripheral integrated circuit elements, an ASIC or other integrated circuit, a hardware electronic logic circuit such as a discrete element circuit, and/or a programmable logic device such as a PLD, PLA, FPGA, or PAL, or the like, etc. In general any device on which resides a finite state machine capable of implementing at least a portion of a method, structure, and/or graphical user interface described herein may be used as an information device. An information device can include well-known components such as one or more network interfaces, one or more processors, one or more memories containing instructions, and/or one or more input/output (I/O) devices, one or more user interfaces, etc.

Internet—an interconnected global collection of networks that connect information devices.

iteration—a repetition.

machine-readable medium—a physical structure from which a machine can obtain data and/or information. Examples include memory devices, punch cards, etc.

memory device—any device capable of storing analog or digital information, for example, a non-volatile memory, volatile memory, Random Access Memory, RAM, Read Only Memory, ROM, flash memory, magnetic media, a hard disk, a floppy disk, a magnetic tape, an optical media, an optical disk, a compact disk, a CD, a digital versatile disk, a DVD, and/or a raid array, etc. The memory device can be coupled to a processor and can store instructions adapted to be executed by the processor according to an embodiment disclosed herein.

near-optimal—an approximation that minimizes an error.

network—a communicatively coupled plurality of communication devices.

network interface—any device, system, or subsystem capable of coupling an information device to a network. For example, a network interface can be a telephone, cellular phone, cellular modem, telephone data modem, fax modem, wireless transceiver, ethernet card, cable modem, digital subscriber line interface, bridge, hub, router, or other similar device.

processor—a device for processing machine-readable instruction. A processor can be a central processing unit, a local processor, a remote processor, parallel processors, and/or distributed processors, etc. The processor can be a general-purpose microprocessor, such the Pentium III series of microprocessors manufactured by the Intel Corporation of Santa Clara, Calif. In another embodiment, the processor can be an Application Specific Integrated Circuit (ASIC) or a Field Programmable Gate Array (FPGA) that has been designed to implement in its hardware and/or firmware at least a part of an embodiment disclosed herein.

system—a collection of devices and/or instructions, the collection designed to perform one or more specific functions.

user interface—any device for rendering information to a user and/or requesting information from the user. A user interface includes at least one of textual, graphical, audio, video, animation, and/or haptic elements. A textual element can be provided, for example, by a printer, monitor, display, projector, etc. A graphical element can be provided, for example, via a monitor, display, projector, and/or visual indication device, such as a light, flag, beacon, etc. An audio element can be provided, for example, via a speaker, microphone, and/or other sound generating and/or receiving device. A video element or animation element can be provided, for example, via a monitor, display, projector, and/or other visual device. A haptic element can be provided, for example, via a very low frequency speaker, vibrator, tactile stimulator, tactile pad, simulator, keyboard, keypad, mouse, trackball, joystick, gamepad, wheel, touchpad, touch panel, pointing device, and/or other haptic device, etc. A user interface can include one or more textual elements such as, for example, one or more letters, number, symbols, etc. A user interface can include one or more graphical elements such as, for example, an image, photograph, drawing, icon, window, title bar, panel, sheet, tab, drawer, matrix, table, form, calendar, outline view, frame, dialog box, static text, text box, list, pick list, pop-up list, pull-down list, menu, tool bar, dock, check box, radio button, hyperlink, browser, button, control, palette, preview panel, color wheel, dial, slider, scroll bar, cursor, status bar, stepper, and/or progress indicator, etc. A textual and/or graphical element can be used for selecting, programming, adjusting, changing, specifying, etc. an appearance, background color, background style, border style, border thickness, foreground color, font, font style, font size, alignment, line spacing, indent, maximum data length, validation, query, cursor type, pointer type, autosizing, position, and/or dimension, etc. A user interface can include one or more audio elements such as, for example, a volume control, pitch control, speed control, voice selector, and/or one or more elements for controlling audio play, speed, pause, fast forward, reverse, etc. A user interface can include one or more video elements such as, for example, elements controlling video play, speed, pause, fast forward, reverse, zoom-in, zoom-out, rotate, and/or tilt, etc. A user interface can include one or more animation elements such as, for example, elements controlling animation play, pause, fast forward, reverse, zoom-in, zoom-out, rotate, tilt, color, intensity, speed, frequency, appearance, etc. A user interface can include one or more haptic elements such as, for example, elements utilizing tactile stimulus, force, pressure, vibration, motion, displacement, temperature, etc.

wireless—any means to transmit a signal that does not require the use of a wire or guide connecting a transmitter and a receiver, such as radio waves, electromagnetic signals at any frequency, lasers, microwaves, etc., but excluding purely visual signaling, such as semaphore, smoke signals, sign language, etc.

wireline—any means to transmit a signal comprising the use of a wire or waveguide (e.g., optical fiber) connecting a transmitter and receiver. Wireline communications can comprise, for example, telephone communications over a POTS network.

DETAILED DESCRIPTION

1. Introduction

One of the central problems of modern mathematical approximation theory is to approximate functions, or signals, concisely, with elements from a large candidate set called a dictionary. Formally, we are given a signal $A \in R^N$ and a dictionary $D=\{\phi_i\}_{i \in I}$ of unit vectors that span $R^N$. A representation R of B terms for input $A \in R^N$ is a linear combination of dictionary elements, $R=\Sigma_{i \in \Lambda} \alpha_i \phi_i$ for $\phi_i \in D$ and some $\Lambda$, $|\Lambda| \leq B$. Typically, $B<<N$, so that R is a concise approximation to signal A. The error of the representation indicates by how well it approximates A, and is given by $\|A-R\|_2 = \sqrt{\Sigma_t |A[t]-R[t]|^2}$. The problem is to find the best B-term representation, i.e., find a R that minimizes $\|A-R\|_2$ dictionary may be redundant in the sense that there is more than one possible exact representation for A, i.e., $|D|>N=\dim(R^N)$. Redundant dictionaries are used because, both theoretically and in practice, for important classes of signals, as the size of a dictionary increases, the error and the conciseness of the approximations improve.

We present the first known efficient algorithm for finding a provably approximate representation for an input signal over redundant dictionaries. We identify and focus on redundant dictionaries with small coherence (i.e., vectors are nearly orthogonal). We present an "algorithm that preprocesses any such dictionary in time and space polynomial in $|D|$, and obtains an $1+\epsilon$ approximate representation of the given signal in time nearly linear in signal size N and polylogarithmic in $|D|$; by contrast, most algorithms in the literature require $\Omega(|D|)$ time, and, yet, provide no provable bounds. The technical crux of our result is our proof that two commonly used local search techniques, when combined appropriately, gives a provably near-optimal signal representation over redundant dictionaries with small coherence. Our result immediately applies to several specific redundant dictionaries considered by the domain experts thus far." In addition, we present new redundant dictionaries which have small coherence (and therefore are amenable to our algorithms) and yet have significantly large sizes, thereby adding to the redundant dictionary construction literature.

Work with redundant dictionaries forms the emerging field of highly nonlinear approximation theory. We have presented algorithmic results for some of the most basic problems in this area, but other mathematical and algorithmic questions remain to be explored.

1.2 Mathematical Approximation Theory

The main problem of mathematical approximation theory is to approximate functions compactly, i.e., in small space, or using a "small number of terms." Formally, we are given a signal $A \in R^N$ and a dictionary $D=\{\Phi_i\}_{i \in I}$ of unit vectors that span $R^N$. A representation R of B terms for input $A \in R^N$ is a linear combination of dictionary elements, $R=\Sigma_{i \in \Lambda} \alpha_i \Phi_i$ for $\Phi_i \in D$ and some $\Lambda$, $|\Lambda| \leq B$. Typically, $B<<N$. The error of the representation indicates how well it approximates A. Following the most common practice, we use $l^2$ norm: the error of approximation is $\|A-R\|_2 = \sqrt{\Sigma_t |A[t]-R[t]|^2}$ henceforth written $\|A-R\|$ or (equivalently) its square.

Mathematical approximation theory has applications in numerical computations, e.g., adaptive partial differential equation solvers, audio signal compression, image compression and statistical estimation with its applications to classification. It is a rich area with significant mathematical achievements and successful applications, both classical and novel; see References 8 and 9 for good surveys, and The Journal of Approximation Theory (Reference 16) and Constructive Approximation (Reference 2) for current mathematical developments.

There are two approaches to mathematical approximation theory:

1. Linear Approximation Theory. We approximate functions using a fixed linear subspace of the dictionary independent of the signal. For example, if the dictionary is the Fourier basis, a B-term approximation of A is given by the first (lowest) B frequencies of its Fourier expansion.
2. Nonlinear Approximation Theory. We seek the best or optimal B-term approximation, i.e., R with $|\Lambda|=B$ such that $\|A-R\|$ is minimized. In this setting, the terms used depend on the signal and do not come from a fixed subspace. There are two further variations. In standard nonlinear approximation theory, the dictionary is an orthonormal basis of size N and each function has a unique exact representation R. It is easy to prove by Parseval's equality that the best B term representation comprises the B largest $|<A, \phi>|$ over $\phi \in D$. In highly nonlinear approximation theory, the dictionary is redundant and is larger than N. Signals have more than one exact representation over D and the best collection of B terms need not be the B largest.

Generally, one wants to relate the quality of a representation to other parameters, such as B, the number of terms in the representation (a central mathematical question) or computational cost (in terms of N, B and $|D|$, a central algorithmic question). There is considerable mathematical analysis of linear and standard nonlinear approximation theory and the algorithmic issues in both are fairly straightforward. Generalizing from linear to standard non-linear to highly-non-linear theory yields much better representations, but pose much harder mathematical and algorithmic challenges. "Redundancy on the one hand offers much promise for greater efficiency in terms of approximation rate, but on the other hand, gives rise to highly nontrivial theoretical and practical problems" (quoted from Reference 23). In fact, the mathematics of the theory of highly nonlinear approximation is only now emerging, and algorithmic complexity of these problems is wide open. The subject of this paper is the central algorithmic issue in highly non-linear approximation theory: for a given function A, parameter B and a prespecified dictionary D, finding the optimal representation of B terms.

The general highly-non-linear approximation problem of our interest is NP-hard (see Reference 7). In fact, the proof there implicitly shows that the problem is NP-hard even to determine whether the optimal error is zero for the given B; hence, unless P=NP, no polynomial time algorithm exists that approximates the best B-term representation over an arbitrary dictionary even if we wish only to approximate the optimal error by a factor, however large.

As a consequence, research in nonlinear approximation theory has mostly focused on specific dictionaries. Mathematicians have studied specific dictionaries—spikes and sinusoids (Reference 4), wavelet packets (References 5, 25, and 24), frames (Reference 6), time/frequency tilings with algebraic hierarchical structure (Reference 19)—and presented individual algorithms (some provable, some heuristic) for constructing the best B-term approximation for any given function. Also, certain "mathematical recipes" such as algorithms for infinite dimensional Hilbert and Banach spaces have been proposed (see References 22 and 23). Save these exceptions, no provable, algorithmic results—running time for finding provably approximate B-term representations for inputs over general redundant dictionaries—are currently known.

1.3 Local Search Heuristics

Most of the heuristic algorithms for general redundant dictionaries are local search methods. We briefly summarize them because they are relevant to our results. There are two common approaches.

1. Find the j such that $\phi=\phi_j$ maximizes $<A-R, \phi>$ over $\phi \in D$. Update R by $R \leftarrow R+<A-R, \phi>\phi$, and repeat a total of B times. More generally, find the set $\Lambda$ of $B' \leq B$ of j's with the largest dot products, and put $R \leftarrow R+\Sigma_{j \in \Lambda}<A, \phi_j>\phi_j$. We call this technique B'-fold matching pursuit, B'-MP, for $B' \geq 1$.
2. Maintain a small subset $\Lambda \subseteq D$. Find the j such that $\phi=\phi_j$ maximizes $<A-R, \phi>$ over $\phi \in D$, and update $\Lambda \leftarrow \Lambda \cup \{\phi_j\}$. Update R to be the optimal representation of the signal over the subspace spanned by $\{\phi:\phi \in \Lambda\}$, and repeat this process a total of B times. This technique is called orthogonal matching pursuit, OMP.

Both of these approaches have been studied extensively in the literature (MP appears in Reference 18 and OMP appears in Reference 21). However, there are two drawbacks.

The first issue is of proving bounds on the error of the solution. We note that in mathematical literature, the usual guarantee proved—if any bound at all is given—is that the error of the representation drops off at a prescribed rate as a function of B, for all signals in a given input class. From an algorithmic viewpoint such as ours, we wish to compare the error of the algorithms' output to the error of the optimal representation, whatever the optimal error may be, for a given signal and B. This viewpoint appears to be novel in mathematical approximation theory literature.

If the dictionary is an orthonormal basis, then the local search techniques above are equivalent and provably find the global optimum. In general, however, these methods do not provide any useful approximation results for finding the best representation for input functions (these are polynomial time heuristics for the NP-hard problem). Such an approximation result is not known even for special redundant dictionaries studied in the literature.

The second issue is of providing an efficient implementation, in particular, for performing each step of the local search. All known algorithms require at least $\Omega(|D|)$ time. Indeed, the general problem of finding the $\phi$ from the dictionary D that has the largest inner product with the signal is equivalent to the Farthest Neighbors Problem, which faces the same "dimensionality bottleneck" as the Nearest Neighbors Problem (see References 14, 15, and 17). Designing efficient algorithms for this problem is still an open challenge, in particular, since the local search heuristics rely on finding the optimal such $\phi$'s. This is a serious drawback because the community of researchers in highly nonlinear approximation theory are applied mathematicians who care about practical, implementable algorithms.

1.4 Our Contributions

One might be tempted to study the problem assuming the dictionary is arbitrary so as to be general. However, an arbitrary dictionary is not a well-motivated choice. We would like to make the dictionaries as large as possible to achieve as high a rate of compression as possible; however, for specific classes of applications (e.g., encoding low-quality speech signals, compressing high motion video), the salient features of these signals are well-described by specific inherently suitable dictionaries. These dictionaries exhibit certain a naturalness for these applications such as smoothness, oscillatory behavior, etc. Redundant dictionaries must, therefore, balance the two needs—naturalness and succinctness of vectors on one hand and size on the other—and designing them is sometimes an art. We would like our algorithmic results to apply to largest number of redundant dictionaries proposed by domain experts in this area.

Further, it is natural to consider the scenario when the dictionary is provided ahead of time for preprocessing. The dictionary is typically large, say, of size $\Omega(N)$. Our goal is to process the input signal and determine a (near) optimal representation very efficiently. In particular, we would prefer to avoid scanning the dictionary entirely while processing the input signal.

We identify and focus on redundant dictionaries of small coherence. A $\mu$-coherent dictionary D has coherence $\mu$, for $0 \leq \mu \leq 1$, if $|<\phi_1, \phi_2>| \leq \mu$ for all distinct $\phi_1, \phi_2 \in D$. A typical way to generate redundant dictionaries in practice is to take several orthonormal bases and combine them, and one gets the most out of this combination if the bases were as orthogonal to each other as possible (using sinusoids and spikes, as in Reference 11, is an example). Dictionaries generated in this manner have small coherence, thus motivating our work here. Coherence has been discussed as an important notion in the context of local search heuristics in the literature (see Reference 18), but we appear to the first to formalize the concept of coherent dictionaries and study the algorithmic problem of representing function near-optimally over i-coherent dictionaries.

We make two contributions. Recall that the problem is, given input signal A and parameter B, determine the optimal B-term representation R over dictionary D of coherence $\mu$, i.e., such that $\|A-R\|$ is minimized.

We present an algorithm that for any $\epsilon$, $\mu B^2 = O(\epsilon)$, finds an $(1+\epsilon)$-factor approximation to the optimal representation in time $N(B \log(|D|)/\epsilon)^{O(1)}$; the dictionary preprocessing takes time and space polynomial in $|D|$. We note that we assume that entries in A are bounded by $N^{O(1)}$. The general result requires an additional factor in time and space polynomial in the number of bits in entries of A.

This is the first known provably approximate result for approximating a function under any redundant dictionary with small coherence $O(\epsilon/B^2)$. In addition, it is very fast, taking time nearly linear in the input size modulo the polylogarithmic factor. This is an exponential speedup over previous heuristics that take time $\Omega(|D|)$ (recall that for redundant dictionaries, $|D|$ dominates N). For the dictionary which consists of spikes and sinusoids, our approach specializes to give an algorithm that finds a nearoptimal representation in $O(N^2)$ time, improving the previous best (see Reference 4) of $O(N^{3.5})$ time via Linear Programming.

We explore the concept $\mu$-coherent redundant dictionaries further, adding to the growing knowledge of redundant dictionary construction (see References 3, 10, and 11).

Known redundant dictionaries are of size only $O(N)$ or $O(N \log(N))$; it is desirable to construct larger dictionaries if "natural" properties of a specific application can still be captured. We consider image processing applications and propose a dictionary of significantly larger size: $N_{3;2}/B^6$, that we call segmentlets. This generalizes a number of known natural constructions in that area (see References 3, 10 and 11), such as beamlets, wedgelets, and ridgelets. By design, segmentlets are $\mu$-coherent dictionaries for small $\mu$ and hence our main algorithmic result applies to them too.

Without focusing on any application, we focus on constructing large redundant dictionaries of small coherence. Using the Nisan-Wigderson (Reference 20) combinatorial design, we obtain such a dictionary of size exponential in N. We note that there are other combinatorial design that provide such large dictionaries with small coherence. However, this one can be constructed using small-space which may prove valuable for some application. Our motivation for including the Nisan-Wigderson combinatorial design was primarily to show that even though we focus on small conherence, non-trivial and exponentially large dictionaries can still be constructed.

The first category of result above is our main result, presented in §2. All our results on specific redundant dictionaries can be found in §3.

1.5 Technical Approach

Our algorithm is two-phased local search, OMP followed by MP. The crux of our technical contribution is our proof that in $O(B/\epsilon)$ iterations, our algorithm converges to within $1+\epsilon$ of the optimal representation. At each iteration, this requires one to determine the dictionary element $\phi_j$ whose dot product has magnitude at least $(1-\eta)$ times the largest dot product magnitude, and it suffices to estimate $<A, \phi_j>$ to within $\eta\|A\|$, additively, for some appropriate $\eta$. We are able to implement each such iteration using the approximate nearest neighbors data structures that have been designed recently. That gives the overall result.

There are some similarities between this work and our earlier work on finding near-optimal representations of functions over Fourier (see Reference 13) and Haar wavelet bases (see Reference 12), but also some crucial differences. Both Fourier and wavelet bases are non-redundant dictionaries, and so efficient algorithms already existed for finding even optimal representations over them. The emphasis in the previous work was on working under additional constraints: using only small (polylogarithmic) space and time, a $1a$ sampling or streaming. In our case here with redundant dictionaries, even given polynomial time and space, no previous result was known for optimal (or near-optimal) representation of functions. We do not focus on polylogarthmic space/time models, and leave that additional complication open. From a technical point of view, either OMP or MP by itself will suffice if we wanted to specialize our result for non-redundant basis such as Fourier or Haar wavelet; furthermore, one would not need approximate nearest neighbors. Thus, both the proof of approximation as well as the algorithms are more sophisticated for redundant dictionaries.

2 Representation over Redundant Dictionaries

We consider vectors over $R^N$ for simplicity; everything in this paper can be extended to $C^N$ in an obvious way.

2.1 Small Coherence Dictionary

DEFINITION 2.1. A set $D = \{\phi_i\}$ of elements from $R^N$ is a dictionary with coherence $\mu$ if $\text{span}(D) = R^N$, $\|\phi_i\| = 1$ for all i, and, for all distinct i and j, $|<\phi_i, \phi_j>| \leq \mu$.

The definition of dictionary gives a condition only on pairs of dictionary elements. The following lemma gives an implication to larger sets of vectors.

LEMMA 2.1. Let $\phi_0, \phi_1, \ldots, \phi_B$ be an arbitrary set of B+1 vectors from a dictionary of coherence $\mu$. We have 1. If $\mu B < 1$, then $\{\phi_1, \ldots, \phi_B\}$ is independent.
2. If $\mu B < \frac{1}{2}$, then the projection $\phi_0$ onto the span of the other B vectors has norm at most $\sqrt{2\mu^2 B}$.
3. If $\mu B < \frac{1}{2}$, then there exists a set $\{\psi_i : i=1, \ldots, B\}$ of vectors such that:
   The $\psi$'s form an orthonormal system.
   $\text{span}(\psi_1, \ldots, \psi_B) = \text{span}\{\phi_1, \ldots, \phi_B\}$.
   $\|\psi_i - \phi_i\|^2 \leq 8 \mu^2 B$.

Proof. First consider taking any linear combination $\phi_1, \ldots, \phi_B$. We have $\|\Sigma_{i=1}^B \alpha_i \phi_i\|^2 \geq \Sigma_{i=1}^B \alpha_i^2 - \Sigma_{i \neq j} |\alpha_i \alpha_j <\phi_i, \phi_j>| $, and $\Sigma_{i \neq j} |\alpha_i \alpha_j <\phi_i, \phi_j>| \leq \mu \Sigma_{i \neq j} |\alpha_i \alpha_j| \leq \mu (\Sigma_{i=1}^B |\alpha_i|)^2 \leq \mu B \Sigma_{i=1}^B \alpha_i^2$ by the Cauchy-Schwarz inequality, so $$\left\|\sum_{i=1}^{B} a_i \phi_i \right\|^2 \geq (1 - \mu B) \sum_{i=1}^{B} a_i^2 \quad (2.1)$$

This gives the first statement.

The length of the projection $\pi_0$ of $\phi_0$ onto $\text{span}(\phi_1, \ldots \phi_B)$ is equal to the dot product $<\pi_0, u_0>$ of $\pi_U$ with the unit vector $u_U$ along $\pi_U$, which also equals $<\phi_0, u_0>$. By the Cauchy-Schwarz inequality, this is the maximum, over all unit vectors $u \in \text{span}(\phi_1, \ldots, \phi_B)$, of $<\phi_0, u>$. Write $$u = \frac{\Sigma_i a_i \phi_i}{\|\Sigma_i a_i \phi_i\|}$$

where $\Sigma_i \alpha_i^2 = 1$; note that the denominator is at least $\sqrt{1-\mu B}$, by the above. Thus $\|\pi_0\|^2$ is at most $\max_{\|u\|=1} <u, \phi_0>^2$, which is at most $$\max_{\Sigma_i a_i^2 = 1} \frac{\langle \Sigma_i a_i \phi_i, \phi_0 \rangle^2}{\|\Sigma_i a_i \phi_i\|^2} \leq \max$$

using the Cauchy-Schwarz inequality. This gives the second statement.

As for the third statement, let $\Omega_1'$ be $\phi_1 - \pi_1$, where $\pi_1$ is the projection of $\phi_1$ onto the span of $\{\phi_2, \ldots, \phi_B\}$. Thus $\Omega_1'$ is orthogonal to $\{\phi_2, \ldots, \phi_B\}$ and $\text{span}(\psi_1', \phi_2, \phi_3, \ldots, \phi_B) = \text{span}(\phi_1, \phi_2, \phi_3, \ldots, \phi_B)$.

By the above, $\|\psi_1' - \phi_1\|^2 = \|\pi_1\|^2 \leq 2 \mu^2 B$. Let $$\psi_1 = \frac{\psi_1'}{\|\psi_1'\|}.$$

Since $\|\psi_1'\|^2 + \|\pi_1\|^2 = \|\phi_1\|^2 = 1$, it follows that $1 - 2\mu^2 B \leq \|\psi_1'\|^2 \leq 1$, so $\sqrt{1 - 2\mu^2 B} \leq \|\psi_1'\| \leq 1$, and $\|\psi_1 - \psi_1'\| \leq 1 - \sqrt{1 - 2\mu^2 B} \leq 2 \mu^2 B$. Since $\|\psi_1' - \phi_1\| \leq \sqrt{2\mu^2 B}$, it follows $\|\psi_1 - \phi_1\| \leq \sqrt{2\mu^2 B} + 2\mu^2 B \leq 2\sqrt{2 2\mu^2 B}$, using the fact that $x^2 \leq x$ for $0 \leq x \leq 1$.

Recursively find $\psi_2, \ldots, \psi_B$ that are orthogonal, have the same span as $\phi_2, \ldots, \phi_B$, and such that $\|\psi_i - \phi_i\|^2 \leq 8\mu^2(B-1) \leq 8\mu^2 B$.

Given as above $\{\phi_i\} \subseteq D$, we say that $\{\psi_i\}$ is an orthogonalization of $\{\phi_i\}$.

2.2 Overall Algorithm

Our overall algorithm is as follows. Starting with the zero representation $R_1 = 0$, we perform OMP (the "error phase") until $\|A - R_1\|^2 \leq 64B \|A - R_{opt}\|^2$. Suppose that $R_1$ consists of $B' < B$ terms. We then perform a single round of MP (the "energy phase") to find a near-best $(B-B')$-term representation $R_2$ to $A - R_1$. We then output $R_1 + R_2$.

More quantitatively, we proceed as follows. Below, we first consider the energy phase. That is, given a signal A, we show how to find a representation R for A with square error $\|A-R\|^2 \leq \|A-R_{opt}\|^2 + \epsilon' \|A\|^2$; i.e., worse than optimal by a small multiple of the energy of the signal. Our ultimate goal is the stronger statement, $\|A-R\|^2 \leq (1+\epsilon) \|A-R_{opt}\|^2 = \|A-R_{opt}\|^2 + \epsilon \|A-R_{opt}\|^2$, where $\epsilon$ and $\epsilon'$ depend on B and $\mu$. To do that, we show a modest error result (that is used first in the overall algorithm): given a signal A, we can find a representation R to A with square error $\|A-R\|^2 \leq 64B \|A-R_{opt}\|^2$. That is, the square error of R is at most a moderate multiple of the optimal square error to the signal.

Finally, combining these results, letting $\delta = \|A - R_{opt}\|$ denote the optimal square error, we first reduce the square error to $64 B \delta^2$, then, by representing the residual, we reduce the square error to be additively suboptimal by $\epsilon'(64B\delta^2)$. The result will have square error $(1 + 64B\epsilon')\delta^2 = (1+\epsilon)\delta^2$, by definition of $\epsilon$.

2.3 Algorithm Details 2.3.1 Energy Phase

We first show that we can roughly compare the error of two candidate representations for A, $\Sigma_{i \in \Lambda_1} \alpha_i \phi_i$ and by $\Sigma_{i \in \Lambda_2} \beta_1 \phi_i$ comparing $\Sigma_{i \in \Lambda_1} <A, \phi_i>$ with $\Sigma_{i \in \Lambda_2} <A, \phi_i>$ LEMMA 2.2. Suppose $\mu B \leq 1$. Let $R_1 = \Sigma_{i \in \Lambda_1} \alpha_i \phi_i$ and $R_2 = \Sigma_{i \in \Lambda_2} \beta_i \phi_i$ be two B-term representations for A, such that $R_j$ is the optimal representation in span $(\cup_{i \in \Lambda_j} \phi_j)$, $j=1, 2$. If $\Sigma_{i \in \Lambda_1} <A, \phi_i>^2 \geq \Sigma_{i \in \Lambda_2} <A, \phi_i>^2$, then $$\|A - R_1\|^2 \leq \|A - R_2\|^2 + 32 \,\mu B \|A\|^2$$

Proof. Let $\{\psi_i : i \in \Lambda_1\}$ be an orthogonalization of $\{\phi_i : i \in \Lambda_1\}$. Observe that $R_j = \Sigma_{i \in \Lambda_j} <A, \psi_i>$, since each side is the unique best representation over span $(\{\phi_i : i \in \Lambda_j\} = \text{span}(\{\psi_i : i \in \Lambda_j\})$. Since $\|A - R_j\|^2 = \|A\|^2 - \Sigma_{i \in \Lambda_j} <A, \psi_i>^2$, it suffices to show that $|\Sigma_{i \in \Lambda_j} <A, \psi_i>^2 - \Sigma_{i \in \Lambda_j} <A, \phi_i>^2| \leq 16 \,\mu B \|A\|^2$ Proceeding, we have $$\sum_{i \in \Lambda_j} |\langle A, \psi_i \rangle|^2 = \sum_{i \in \Lambda_j} |\langle A, \phi_i \rangle + \langle A, \psi_i - \phi_i \rangle|^2$$

$$= \sum_{i \in \Lambda_j} (|\langle A, \phi_i \rangle| - |\langle A, \psi_i - \phi_i \rangle|)^2$$

$$= \sum_{i \in \Lambda_j} |\langle A, \phi_i \rangle|^2 - 2 \sum_{i \in \Lambda_j} |\langle A, \phi_i \rangle||\langle A, \psi_i - \phi_i \rangle|.$$

A bound for the last term will be reused below, so we isolate it. By Lemma 2.1, it is at most $2\sqrt{8\mu^2 B} \|A\| \Sigma_{i \in \Lambda_j} |<A, \phi_i>|$ which, by the Cauchy-Schwarz inequality, is at most $2 \sqrt{8\mu^2 B} \|A\| \sqrt{B \Sigma_{i \in \Lambda_j} |<A, \phi_i>|^2}$. Continuing, $$\sqrt{B \sum_{i \in \Lambda_j} |\langle A, \phi_i \rangle|^2} \leq \sqrt{B \sum_{i \in \Lambda_j} (|\langle A, \psi_i \rangle| + |\langle A, \phi_i - \psi_i \rangle|)^2}$$

$$\leq \sqrt{2B \sum_{i \in \Lambda_j} (|\langle A, \psi_i \rangle|^2 + |\langle A, \phi_i - \psi_i \rangle|^2)}$$

$$\leq \sqrt{2B \|A\|^2 + 8\mu^2 B^3 \|A\|^2},$$

so that $2 \Sigma_{i \in \Lambda_j} |<A, \phi_i>||<A, \psi_i - \phi_i>| \leq 8 \,\mu B \|A\|^2 \sqrt{1 + 4\mu^2 B^2} \leq 8 \,\mu B \sqrt{2} \|A\|^2$, and $\Sigma_{i \in \Lambda_j} <A, \psi_i>^2 \geq \Sigma_{i \in \Lambda_j} <A, \phi_i>^2 - 16 \,\mu B \|A\|^2$ Similarly, $$\Sigma_{i\in\Lambda_j}|\langle A, \psi_i\rangle|^2 \leq \Sigma_{i\in\Lambda_j}|\langle A, \phi_i\rangle|^2 + 2\Sigma_{i\in\Lambda_j}|\langle A, \phi_i\rangle|\cdot|\langle A, \psi_i-\phi_i\rangle| + \Sigma_{i\in\Lambda_j}|\langle A, \psi_i-\phi_i\rangle|^2,$$

which is at most $$\Sigma_{i\in\Lambda_j}|\langle A, \phi_i\rangle|^2 + 8\,\mu B\sqrt{2}\|A\|^2 + 8\,\mu^2 B^2\|A\|^2 \leq \Sigma_{i\in\Lambda}|\langle A, \phi_i\rangle|^2 + 16\,\mu B\|A\|^2,$$

since $\mu B \leq \frac{1}{2}$. The result follows.

Algorithmically, one finds the B vectors $\emptyset \in D$ with largest dot products to A, then finds the best representation R to A over the span of those vectors (for example, by orthogonalizing the vectors first). The resulting representation R will have square error $\|A-R\|^2 \leq \|A-R_{opt}\|^2 + \epsilon\|A\|^2$, for $\epsilon = 32\,\mu B$.

COROLLARY 2.1. For a signal A, a single iteration of B-fold Matching Pursuit over a $\mu$-coherent dictionary D returns a representation R with $$\|A-R\|^2 \leq \|A-R_{opt}\|^2 + 32\,\mu B\|A\|^2$$

2.3.2 Error Phase

Lemma 2.4 below says that if we have a representation R whose error is significantly worse than optimal (roughly, error $\sqrt{B}\delta$ compared with optimal value of $\delta$), then the ø with largest dot product represents so much of the signal that we are forced to take it in any optimal or near-optimal representation. This principle will be used, later, to show correctness of a greedy algorithm.

First we prove a lemma that will be useful.

LEMMA 2.3. Fix $B>0$. Let A be a signal. Let $\Lambda$ be a set of size less than B, and let $R=\Sigma_{i\in\Lambda}\alpha_i\phi_i$ be the best representation for A over $\{\phi_i: i\in\Lambda\}$. Let $R_{opt}=\Sigma_{i\in\Lambda_{opt}}\alpha_i^{opt}\phi_i$ be the best B-term representation for A over all D), subject to $\Lambda \subseteq \Lambda_{opt}$. (Note that $\alpha_i$ does not necessarily equal $\alpha_i^{opt}$.) If $\|A-R\|^2 \geq (1+\epsilon)\|A-R_{opt}\|^2$ for $64\,\mu^2 B^2 \leq \epsilon < 1$, then there exists $i \in \Lambda_{opt}\setminus\Lambda$ such that $$\langle A-R, \phi_i\rangle^2 \geq \frac{\epsilon}{8B}\|A-R\|^2$$

Proof. Note that $(1+\epsilon)>(1-\epsilon/2)^{-1}$, so the hypothesis $\|A-R\|^2 \geq (1+\epsilon)\|A-R_{opt}\|^2$ implies $(1-\epsilon/2)\|A-R\|^2 \geq \|A-R_{opt}\|^2$, so that $\|A-R\|^2 - \epsilon/2\|A-R\|^2 \geq \|A-R_{opt}\|^2$ and $\|A-R\|^2 - \|A-R_{opt}\|^2 \geq \epsilon/2\|A-R\|^2$.

Let $\{\psi_i\}$ be an orthogonalization of $\{\phi_i: \phi_i \in \Lambda_{opt}\}$ extending an orthogonalization of $\{\phi_i: \phi_i \in \Lambda\}$ Then $R_{opt}$ is the best representation over $\{\psi_i: i\in\Lambda_{opt}\}$ and R is the best representation over $\{\psi_i: i\in\Lambda\}$. Furthermore, by orthogonality, $R_{opt}=\Sigma_{i\in\Lambda_{opt}}\langle A, \psi_i\rangle\psi_i$ and $R=\Sigma_{i\in\Lambda}\langle A, \psi_i\rangle\psi_i$, using the same coefficients as $R_{opt}$.

By Parseval's equality and orthogonality, $$\|A-R\|^2 - \|A-R_{opt}\|^2 = \|R_{opt}-R\|^2$$

which equals $\Sigma_{i\in\Lambda_{opt}\setminus\Lambda}\langle A, \psi_i\rangle^2$, So it follows that, for some $i\in\Lambda_{opt}\setminus\Lambda$, we have $$\langle A, \psi_i\rangle^2 \geq \frac{\|A-R\|^2 - \|A-R_{opt}\|^2}{B} \geq \frac{\epsilon}{2B}\|A-R\|^2.$$

Since R is orthogonal to $\psi_i$, it follows that $\langle A-R, \psi_i\rangle^2 = \langle A, \psi_i\rangle^2 \geq \epsilon/2B\|A-R\|^2$ Now, $$|\langle \phi_i - \psi_i, A - R\rangle| \leq \|\phi_i - \psi_i\|\cdot\|A - R\| \leq (\sqrt{8\mu^2 B})\|A - R\| \leq \left(\sqrt{\frac{\epsilon}{8B}}\right)\|A - R\|,$$

so $$|\langle A - R, \phi_i\rangle| \geq |\langle A - R, \psi_i\rangle| - |\langle A - R, \psi_i - \phi_i\rangle| \geq \left(\sqrt{\frac{\epsilon}{2B}} - \sqrt{\frac{\epsilon}{8B}}\right)\|A - R\| = \sqrt{\frac{\epsilon}{8B}}\|A - R\|,$$

and the result follows.

LEMMA 2.4. Let A be a signal and let $R=\Sigma_{i\in\Lambda}\alpha_i\phi_i$ be the best representation for A over $\Lambda$ of size less than B. Suppose there's a set $A_{opt} \supseteq \Lambda$ with $|A_{opt}|=B$, and a representation $R_{opt}=\Sigma_{i\in\Lambda_{opt}}\beta_i\phi_i$ for A such that $\|A-R\|^2 > 64\,B\|A-R_{opt}\|^2$. Finally, assume $$8\mu^2(B+1) < \frac{1}{64B}.$$

If $\emptyset=\emptyset_i$ maximizes $\langle A-R, \emptyset\rangle$ over $\emptyset \in D$, then $i\in\Lambda_{opt}$.

Proof. Suppose not. By Lemma 2.3 with $\epsilon = \frac{1}{2}$, since $\phi_i$ is maximal, $$\langle A - R, \phi_i\rangle^2 \geq \frac{1}{16B}\|A - R\|^2.$$

Let $\{\psi_j\}$ denote an orthogonalization of $\{\phi_j: j\in\Lambda_{opt}\cup\{i\}\}$. Then $$\langle A - R, \psi_i\rangle \geq \langle A - R, \phi_i\rangle - \|A - R\|\|\phi_i = \psi_i\| \geq \left(\sqrt{\frac{1}{16B}} - \sqrt{8\mu^2(B+1)}\right)\|A - R\| \geq \left(\sqrt{\frac{1}{16B}} - \sqrt{\frac{1}{64B}}\right)\|A - R\|,$$

so that $$\langle A - R, \psi_i\rangle^2 \geq \frac{1}{64B}\|A - R\|^2 > \|A - R_{opt}\|^2.$$

On the other hand, since $\psi_i$ is orthogonal to $\Lambda_{opt} \ni$ span $(\Lambda_{opt}\setminus\Lambda)$, it follows that $\langle A-R, \psi_i\rangle = \langle A-R_{opt}, \psi_i\rangle + \langle R_{opt}-R, \psi_i\rangle = \langle A-R_{opt}, \psi_i\rangle$ Also, by optimality of $R_{opt}$, $A-R_{opt}$ is orthogonal to $R_{opt}$, so that $\|A-R_{opt}\|^2 = \|A\|^2 - \|R_{opt}\|^2$. Finally, since $\psi_i$ is orthogonal to $\Lambda_{opt} \supseteq \Lambda$, $\Lambda\cup\{i\}$ can be extended to a basis, and we have $\|A\|^2 \geq \|R_{opt}\|^2 + \langle A-R_{opt}, \psi_i\rangle^2$, i.e. $\langle A-R, \psi_i\rangle^2 = \langle A-R_{opt}, \psi_i\rangle^2 \leq \|A\|^2 - \|R_{opt}\|^2 = \|A-R_{opt}\|^2$, a contradiction.

Algorithmically, we can start with a signal A and representation R=0 over subspace $\Lambda=\emptyset$. As long as $\|A-R\|^2 > 64B\|A-R_{opt}\|^2$, we can identify a vector $\phi \in D$ that is in every optimal representation. We add $\phi$ to $\Lambda$, let R be the best representation over $\Lambda$, and continue looping. We terminate after at most B iterations, and, when we terminate, $\|A-R\| \leq 64B\|A-R_{opt}\|$.

COROLLARY 2.2. For a signal A, Orthogonal Matching Pursuit, in at most B iterations, over a $\mu$-coherent dictionary D, returns a representation R with $\|A-R\|^2 \leq 64B\|A-R_{opt}\|^2$. OMP stopped when $\|A-R\|^2 < 64B\|A-R_{opt}\|^2$ returns a representation over a subspace of dimension $B' \leq B$ that can be extended to a B-dimensional subspace containing an optimal representation.

2.3.3 Putting it All Together

THEOREM 2.1. Fix a dictionary D with coherence $\mu$. Let A be a signal and suppose it has a B-term representation over D with error $\|A-R_{opt}\|=\delta$, where $B<1/(32\mu)$. Then, in iterations polynomial in B, we can find a representation with error at most $\sqrt{(1+2064\mu B^2)}\delta$.

Proof. The algorithm is as follows. Assume we know $\delta=\|A-R_{opt}\|$ in advance; we will remove this assumption below. Use Corollary 2.2 to find a B'-term representation $R_1$ over $\Lambda_1 \subseteq D$ with $\|A-R\|^2 \leq 64B\delta^2$ and such that $\Lambda_1$ is a subset of a space containing an optimal representation. Then use Corollary 2.1 to find a representation $R_2$ with square error at most $32\mu B\|A-R_1\|^2 \leq 32\cdot 64 \mu B^2\|A-R_{opt}\|^2$ worse than the best representation for $A-R_1$. Output $R_1+R_2$.

We note that the hypotheses on $\mu$ and B in Corollaries 2.2 and 2.1 are implied by our hypothesis $B<1/(32\mu)$. Since, as we show below, the best representation for $A-R_1$ has square error at most $\delta^2(1+512\mu^2B^3)$, the overall representation has square error at most $\delta^2(1+512\mu^2B^3+2048\mu B^2) \leq (1+2064\mu B^2)\delta^2$, since $\mu B<1/32$. It remains only to show that $A-R_1$ has a representation with square error at most $\delta^2(1+512\mu^2B^3)$.

To see this, fix an optimal representation $R_{opt}\Sigma_{i\in\Lambda}\beta_i\phi_i$ consisting of vectors in some $\Lambda \supseteq \Lambda_1$. Let $\{\psi_i\}$ denote an orthogonalization of $\{\phi_i:\phi_i\in\Lambda\}$ that extends an orthogonalization of $\{\phi_i:\phi_i\in\Lambda_1\}$. Then $R_{opt}=\Sigma_{i\in\Lambda}<A, \psi_i>\psi_i$ and $R_1=\Sigma_{i\in\Lambda_1}<A, \psi_i>\psi_i$.

Consider $R_{opt}-R_1$, which is orthogonal to $R_1$ and to $A-R_{opt}$. We first claim that $R_{opt}-R$ has some good $(B-|\Lambda_1|)$-term representation over D. Specifically, we will approximate $R_{opt}-R_1=\Sigma_{i\in\Lambda\setminus\Lambda_1}<R_{opt}-R_1\psi_i>\psi_i$ by $\Sigma_{i\in\Lambda\setminus\Lambda_1}<R_{opt}-R_1\psi_i>\phi_i$. Since each $\|\psi_1-\phi_1\|$ is small, we expect that substituting $\phi_i$ for $\psi_i$ in the expansion for $R_{opt}-R$ to be a small perturbation.

We have $\|(R_{opt}-R_1)-\Sigma_{i\in\Lambda\setminus\Lambda_1}<R_{opt}-R_1, \psi_i>\phi_i\|^2=\|\Sigma_{i\in\Lambda\setminus\Lambda_1}<R_{opt}-R_1, \psi_i>(\psi_i-\phi_i)\|^2$ is at most $\Sigma_{i\in\Lambda\setminus\Lambda_1}<R_{opt}-R_1, \psi_i>^2\Sigma_{i\in\Lambda\setminus\Lambda_1}\|\psi_i-\phi_i\|^2$, which is at most $\|R_{opt}-R_1\|^2 \cdot B(8\mu^2B)$ $$\leq \|A-R_1\|^2 \cdot B(8\mu^2B)$$

$$\leq 64B\delta^2 \cdot B(8\mu^2B)=512\mu^2B^3\delta^2.$$

Since $A-R_{opt}$ is orthogonal to span($\Lambda$), it follows that the $\Sigma_{i\in\Lambda\setminus\Lambda_1}<R_{opt}-R_1\psi_i>\phi_i$ gives a representation for $A-R_1$ with corresponding error, namely $$\left\|(A-R_1)-\sum_{i\in\Lambda\setminus\Lambda_1}\langle R_{opt}-R_1, \psi_i\rangle\phi_i\right\|^2 =$$

$$\|A-R_{opt}\|^2 + \left\|(R_{opt}-R_1)-\sum_{i\in\Lambda\setminus\Lambda_1}\langle R_{opt}-R_1, \psi_i\rangle\phi_i\right\|^2 = \delta^2(1+512\mu^2B^3)$$

Using Lemma 2.2, one can find a $(B-|\Lambda_1|)$-term approximation $R_2$ to $A-R_1$ whose error is at most $32\mu B\|A-R_1\|^2 \leq 32\mu B(64B\delta^2)$ worse, additively, then the best such representation. It follows that $$\|A-(R_1+R_2)\|^2$$

$$\leq \|(A-R_1)-R_2\|^2$$

$$\leq \delta^2(1+512\mu^2B^3)+32\mu B(64B\delta^2)$$

$$\leq \delta^2(1+16\mu B^2+2048\mu B^2), \text{ since } \mu B<1/32$$

$$\leq \delta^2(1+2064\mu B^2)$$

Now suppose we do not know $\delta$ in advance. Then we would not know $B'=|\Lambda_1|$, i.e., we would not know when to switch from the error phase to the energy phase. We simply try all possibilities for $B'<B$.

So far, we have assumed that one can find the $\emptyset \in D$ with largest $|<A, \emptyset>|$ and estimate that dot product in unit time. We can, in fact, make this algorithm feasible and obtain a result similar to Theorem 2.1 using Nearest Neighbor Data Structures (see References 14, 15, and 17). For some c, fix $\epsilon$, $c\mu B^2 \leq \epsilon \leq 1$; our goal will be to find a representation with error at most $(1+\epsilon)$ worse than optimal.

For Lemmas 2.2-2.4 and Theorem 2.1, we can prove that it suffices to find $\emptyset$ with near-biggest dot product and to approximate the dot product; i.e., to find $\emptyset_j$ such that, for all i, $|<A, \phi_j>|^2 \geq |<A, \phi_i>|^2-\eta\|A\|^2$ and to estimate $<A, \phi_j>$ as $<A, \phi_j>_-$ with $|<A, \phi_j>-<A, \phi_j>_-|^2 \leq \eta\|A\|^2$, for some appropriate $\eta$, polynomially related to $B/\epsilon$. There is a limited set S of vectors for which we will want dot products; specifically, we will want $(\psi_1,\psi_2)$ only if each $\psi$ is a linear combination of at most B vectors from $D\cup\{A\}$, in which the coefficients are, by (2.1), at most $O(\|A\|^2)$ (here taken to be $N^{O(1)}$) and written to the unit of precision (here taken to be 1). Thus there are at most $(|D|+1)^{O(B)}$ possible vectors in S. Therefore, we can use the following steps:

Normalize the signal to $$\frac{A}{\|A\|},$$

find a representation for the normalized signal, and scale back up. For the normalized signal, we can get the approximate dot product operations from approximate $l^2$ distance operations.

Using Reference 1, randomly project the signal A and the dictionary vectors, using a randomly-chosen linear function h from a particular family, into a $\log |S|/\eta^{O(1)}$ dimensional space so the $l^2$ norm between any pairs of vectors from S is approximated to factor $(1+\eta)$.

Use the approximate nearest neighbor results in References 14, 15 and 17 to return a $(1+\eta)$-approximation to the closest dictionary vector in $l^2$ norm to a query of the form A-R, in time $(B \log(|D|)/\eta)^{O(1)}$. This allows us to compute $R_1$ of Theorem 2.1. To compute $R_2$ of Theorem 2.1, we need to find the B largest dot products with $A-R_1$. To do that, repeatedly find the $\emptyset_i$ with largest dot product to A-R and, by properties of the nearest neighbor data structure, remove $h(\emptyset_i)$ from the dictionary, in time $(B \log|D|/\eta)^{O(1)}$. Finally, to approximate the best representation of A over $\Lambda$, find the best formal representation of h(A) over $\{h(\emptyset):\emptyset\in\Lambda\}$ and use those coefficients.

Note that, even for $\emptyset_j\in\Lambda$, it is possible that $<A-R, \phi_j> \neq 0$. In fact, $<A-R, \phi_j>$ may be the maximum dot product over $\emptyset\in D$, so we may need to choose $\phi_j$ on multiple iterations. One can show, however, that only a small number of iterations is needed for OMP to find a B'-term representation $R_1$, $B' \leq B$, with $\|A-R_1\|^2 \leq 64B \|A-R_{opt}\|^2$. The energy phase takes just a single iteration of (B–B')-fold MP. In summary, THEOREM 2.2. Fix a dictionary, D, of coherence $\mu$, over vectors of length N. For certain constants c and c', fix $B < c/\mu$ and fix $\epsilon$, $c' \mu B^2 \leq \epsilon \leq 1$. There is an algorithm that preprocesses D taking time and space $(B|D|/\epsilon)^{O(1)}$. For any given signal, the algorithm produces a representation for A with error $(1+\epsilon)$ times that of the optimal representation taking time $(B \log |D|/\epsilon)^{O(1)}$ only.

Note that some cost dependence on N is hidden by dependence on $|D| \geq N$.

The idea to use nearest neighbor data structures in this context was suggested independently by Piotr Indyk.

3. Special Dictionaries

In this section, we briefly explore the notion of small coherence dictionaries further. We consider several specific dictionaries and analyze their properties.

Three desired properties of redundant dictionaries are their large size, their naturalness, and the possibility to find representations over them quickly. Here "naturalness" encompasses the idea that signals typical of a particular application should have concise, low-error representations, and that the dictionary elements themselves should have semantic significance within the application. These goals are somewhat in conflict with each other; nevertheless, we show that our criterion of low coherence applies to several large and natural dictionaries in the literature (or small variations).

3.1 Spikes and Sinusoids

Two fundamental orthonormal bases are the spikes and sinusoids. A spike is a vector $\delta_s$ defined by $\delta_s(s)=1$ and $\delta_s(t)=0$ for $t \neq s$. A sinusoid is a complex-valued vector $\psi_w$ defined by $$\psi_w(t) = \frac{1}{\sqrt{N}} e^{2\pi i w t/N}.$$

It is immediate that the dot product of any spike with any sinusoid equals $1/\sqrt{N}$ in absolute value and the dictionary D formed by their union is $\mu$-coherent, for $\mu=1/\sqrt{N}$. It follows that the algorithm in Theorem 2.1 applies to this dictionary. Note that, in particular, if the signal is exactly represented as a sum of B spikes and sinusoids, so that the optimal error is zero, then the error of our output is zero—we recover the signal exactly.

We note that Theorem 2.1 gives a running time of $O(B^4 + B^2 N + BN \log(N))$ to find a representation with error at most $(1+O(B^2/\sqrt{N}))$ times optimal. For each of B iterations, we have a subset $\Lambda \subseteq D$ of spikes and sinusoids available for the representation. To find the best representation R over $\Lambda$, we could find an orthonormal basis for span($\Lambda$), which can be done in time $B^3$. We then need to find the $\phi_j$'s with biggest dot products to A–R. We can find all $<\phi_j, A>$'s explicitly in time $O(N \log(N))$ and all $<\phi_j, R>$'s symbolically in time BN. For the extreme case of $B=O(\sqrt{N})$, our algorithm takes time $O(N^2)$ to recover exactly any signal that is exactly represented as B spikes and sinusoids. By contrast, in Reference 4, the authors give an algorithm with runtime $O(N^{3.5})$ which recovers the signal exactly, assuming it consists of B spikes and/or sinusoids. Even for the limited case of an exact representation, their algorithm is quite expensive.

Our algorithm and Reference 4 apply to the combination of any two incoherent orthonormal bases. The analysis above for our algorithm assumes that one of the bases is presented in the coordinate system defined by the other (equivalently, that one can take the dot product between any two dictionary element sin constant time.) If this is not the case, then one could compute and store all $O(N^2)$ such dot products in the time to multiply two N×N matrices, i.e., $N^{2+\alpha}$ for some $\alpha$, $0 < \alpha < 1$.

Other speedups are possible for our algorithm, using Theorem 2.2 in general or using techniques in Reference 13 for the spikes and sinusoids dictionary in particular. Details will be given in the final version of this paper.

3.2 Combinatorial Designs

The dictionary in the previous subsection had small coherence and was a combination of two fundamental orthonormal bases but it was not very large. In fact, we can build a dictionary with small coherence that is considerably larger using a combinatorial design, such as the matrix at the center of the Nisan-Wigderson generator. Specifically, in Reference 20, the authors show how to build a collection S of subsets of Reference 1, N, for N an even power of a prime, such that each subset has size exactly $\sqrt{N}$, any two subsets intersect in at most d places, and the number of subsets is $\Omega(N^{(d+1)/2})$.

Define D by $D = \{N^{-1/4} \chi_S : S \in S\}$. It follows that $|D| = |S| = \Omega(N^{(d+1)/2})$ and, for distinct $\phi_1$ and $\phi_2$ in D, $1 < \phi_1, \phi_2 > | \leq d/\sqrt{N}$.

For $d=2$, we get a superlinear-sized dictionary of size roughly $N^{3/2}$ and coherence roughly $2/\sqrt{N}$. At the other extreme, one can take d almost as large as $\sqrt{N}$, yielding coherence less than 1 and $|D|$ roughly $2^{\sqrt{N}}$. One can also use values for d between the two extremes-for example, if $d=\log(N)$ or $d=N^{1/4}$, the dictionary has $N^{\Omega(\log(N))} > N^{O1}$ or $2^{\Omega(N^{1/4})} >> N^{O(1)}$ elements and coherence $\log(N)/\sqrt{N}$ or $N^{-1/4}$, not much worse than the expected absolute dot product $1/\sqrt{N}$ of a pair of random unit vectors.

This construction gives us non-trivial dictionaries with extremely small coherence, extremely large size, or both, to which we can apply Theorem 2.1 and obtain efficient algorithms.

3.3 Segmentlets

Next, we present a redundant dictionary that is inspired by beamlets (see Reference 11), a dictionary used for edge detection in image analysis. Consider the space of functions on the square array of side $\sqrt{N}$. Fix a parameter p, to be determined later. Consider the set of all line segments with endpoints $(x_1, y_1)$ and $(x_2, y_2)$, such that $x_1$, $y_1$, and $y_2$ are multiples of p and $x_2 = x_1 + p$. Then the number of segments is $\Omega(N^{3/2}/p^3)$, much greater than the dimension, N, of the space of functions, and any two segments intersect at most once and have horizontal extent exactly p.

From each line segment, we next construct a set of pixels, each of which intersects the line segment. In general, a line segment may intersect several contiguous pixels in the same column; in that case, put only the middle one or two intersected pixels into the associated set. It follows that any two sets of pixels constructed this way will intersect in at most $O(1)$ pixels and each will consist of $O(p)$ pixels. For the dictionary, take normalized characteristic functions on theses sets of pixels. The coherence is $O(1/\sqrt{p})$ and the size of the dictionary equals the number of segments, $N^{3/2}/p^3$.

Suppose we are interested in B-term representations. To apply the above techniques, we need coherence less than $1/B$, i.e., $p \geq B^2$. It follows that the dictionary can have size $N^{3/2}/B^6$, which is greater than N for sufficiently small B. In particular, the size of the dictionary is superlinear, by more than log factors. Thus the size of the segmentlet dictionary is larger than the beamlet dictionary, and we can apply Theorem 2.1 to obtain efficient algorithms for near-optimal B-term representations over segmentlets. Segmentlets are natural for capturing edges in images. We believe that this dictionary will have exciting applications in image processing.

4. Remarks

We have presented algorithmic results for the basic problem in highly nonlinear approximation: An efficient algorithm for near-optimal representation of input signals over µ-coherent dictionaries. There are several additional insights we can provide into highly nonlinear approximation problems. We briefly describe them here.

The problem of representing functions using redundant dictionaries has a few variants. As defined above; a representation R for input $A \in R^N$ is a linear combination of dictionary elements, $R = \Sigma_{i \in A} \alpha_i \phi_i$ for $\phi_i \in D$. In general, there are two measures to assess the goodness of the representation. The first is how well it approximates A and we measure this error $\|A-R\|_p$ in $l^p$ norm for $1 \leq p \leq \infty$; the results in this paper focus on p=2. The second metric attempts to capture varying notions of parsimony and we measure this with the $l^q$ norm of the representation itself, $\|R\|_q = \Sigma_{i \in A} |\alpha_i|^q$ for q=0 or $1 \leq q \leq \infty$. We focused throughout on minimizing the $l^2$ norm of the error subject to the $l^0$ norm of the representation equalizing zero. In general, other (p,q) combination may be of interest, and one may want to fix the $l^p$ norm of the error (for example to zero) and minimize the $l^q$ norm of the representation. For example, instead of seeking the best B-term representation, we may seek the representation minimizing $\Sigma_i |\alpha_i|$, i.e. $\|\alpha\|_1$. We have a polynomial time solution for this case via linear programming when p=∞. Let $\Phi$ be the matrix of vector $\phi_i$ at component j, $\Phi_{ij} = \phi_i(j)$. Express each coefficient $\alpha_i$ as a sum of positive and negative parts, $\alpha_i = p_i - n_i$. The linear program is to minimize $\Sigma_i (p_i + n_i)$ subject to $$\begin{cases} (\Phi - \Phi)\begin{pmatrix} p \\ n \end{pmatrix} \leq A + \varepsilon \\ (\Phi - \Phi)\begin{pmatrix} p \\ n \end{pmatrix} \geq A - \varepsilon \end{cases}$$

Another variation is one in which we wish to minimize the energy of the representation, i.e., minimize $\|\alpha\|_2$. This problem has a polynomial time solution via semidefinite programming. This is because minimize $\alpha^t \alpha$ subject to $\|\Phi\alpha - A\|_p \leq \varepsilon$ is a semidefinite program. Note that $\alpha^t \alpha$ is the squared $l^2$ norm of the representation and the constraints define a convex region about the point $A \in R^N$. We have initiated the study of the algorithmic complexity of highly nonlinear approximation problems. Approximation theory is a rich area, and it is active in mathematics, signal processing and statistics; theoretical computer scientists can have a significant impact here. Many algorithmic problems remain open. Finally, as remarked earlier, applied mathematicians in approximation theory care about practical algorithms. We believe that our algorithms here are not difficult to implement, but we leave that study for the future.

Figure 1:
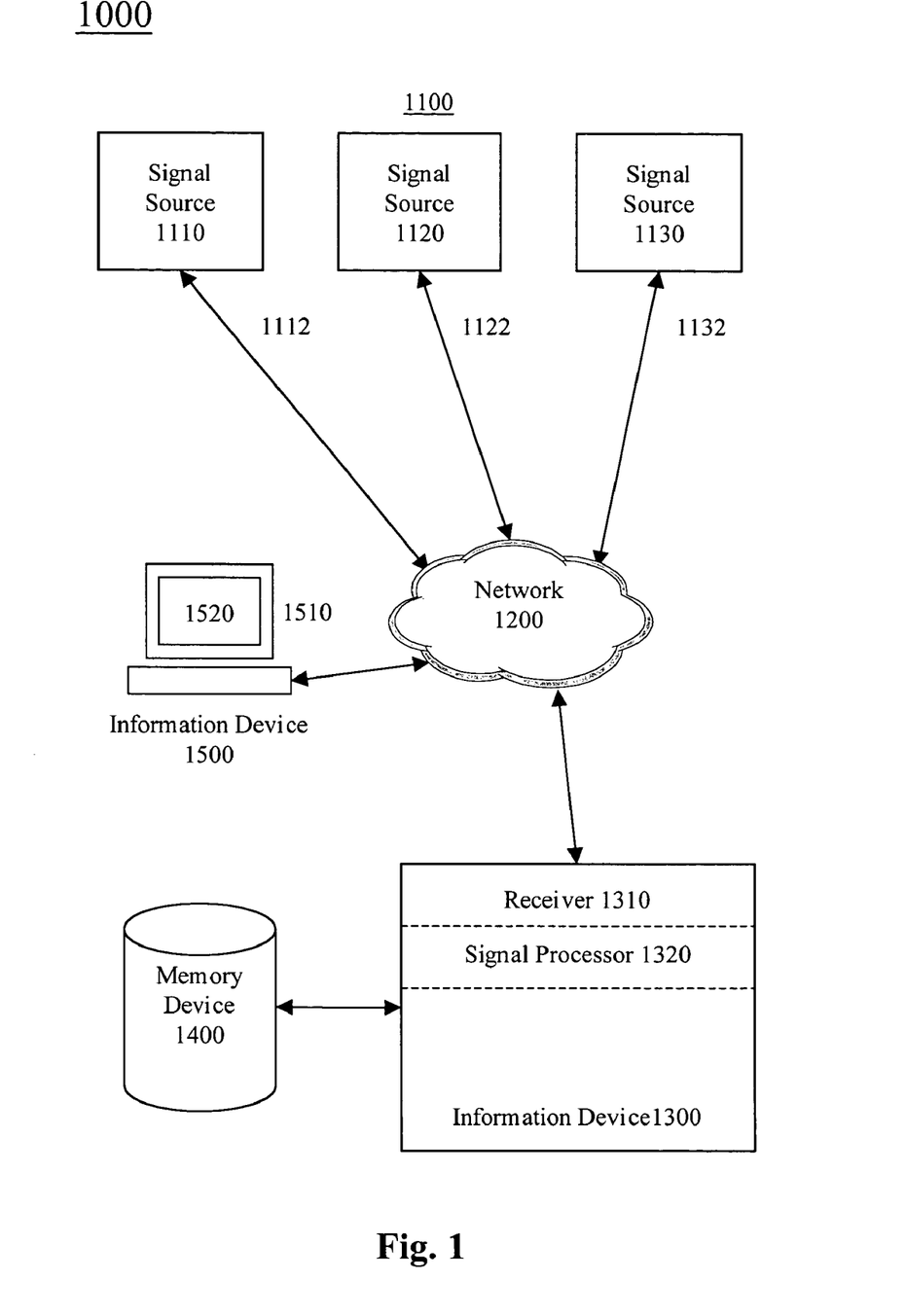
FIG. 1 is a block diagram of an exemplary embodiment of a telecommunications system 1000.

FIG. 1 is a block diagram of an exemplary embodiment of a telecommunications system 1000 that can implement an exemplary embodiment of a method and/or algorithm described herein. System 1000 can comprise any number of signal sources 1100. Any signal source 1110, 1120, 1130 can be an information device. From any signal source 1110, 1120, 1130 can emanate a signal 1112, 1122, 1132, respectively.

Any of the signal sources 1100 can be coupled to a network 1200. Coupled to network 1200 can be any number of information devices 1300 that can receive a signal and/or process a signal. The signal can be an analog or a digital signal. The content of the signal can be, for example, data, audio, speech, and/or video, etc. The signal can be carried by and/or modulated upon a wireless and/or wireline media, including an optical media. For example, the signal can be an optical voice communication; a radar and/or sonar signal; a microwave data transmission; an FM radio audio signal; a landline, cellular, or IP telephone speech signal; a satellite television signal; an e-mail or HTTP message sent over a DSL connection; and/or a Bluetooth data signal, etc.

A signal receiver 1310 can provide a received signal to a signal processor 1320 that can iteratively determine a provable near-optimal B-term representation of the signal. The determined representation can be useful for a wide variety of functions, such as encoding, modulating, compressing, encrypting, detecting, decrypting, decompressing, demodulating, and/or decoding, etc., the signal. Each B-term representation can be formed from a linear combination of a plurality of elements selected from a redundant dictionary. The dictionary can be predetermined and/or µ-coherent. The determined near-optimal B-term representation can correspond to an error that is a minimum of a set of errors corresponding to all possible B-term representations associated with the predetermined redundant µ-coherent dictionary.

Coupled to information device(s) 1300 can be a memory device 1400 that can store one or more dictionaries and/or possible B-term representations. Coupled to network 1200 can be an information device 1500 that can receive the near-optimal B-term representation and/or the B-term representation having the minimum error. Information device 1500 can render any received B-term representation on an output device 1510. Via a user interface 1520 of information device 1500 inputs can be received and/or outputs rendered regarding the dictionaries, errors, representations, and/or the values for B, µ, and/or other relevant parameters.

Figure 2:
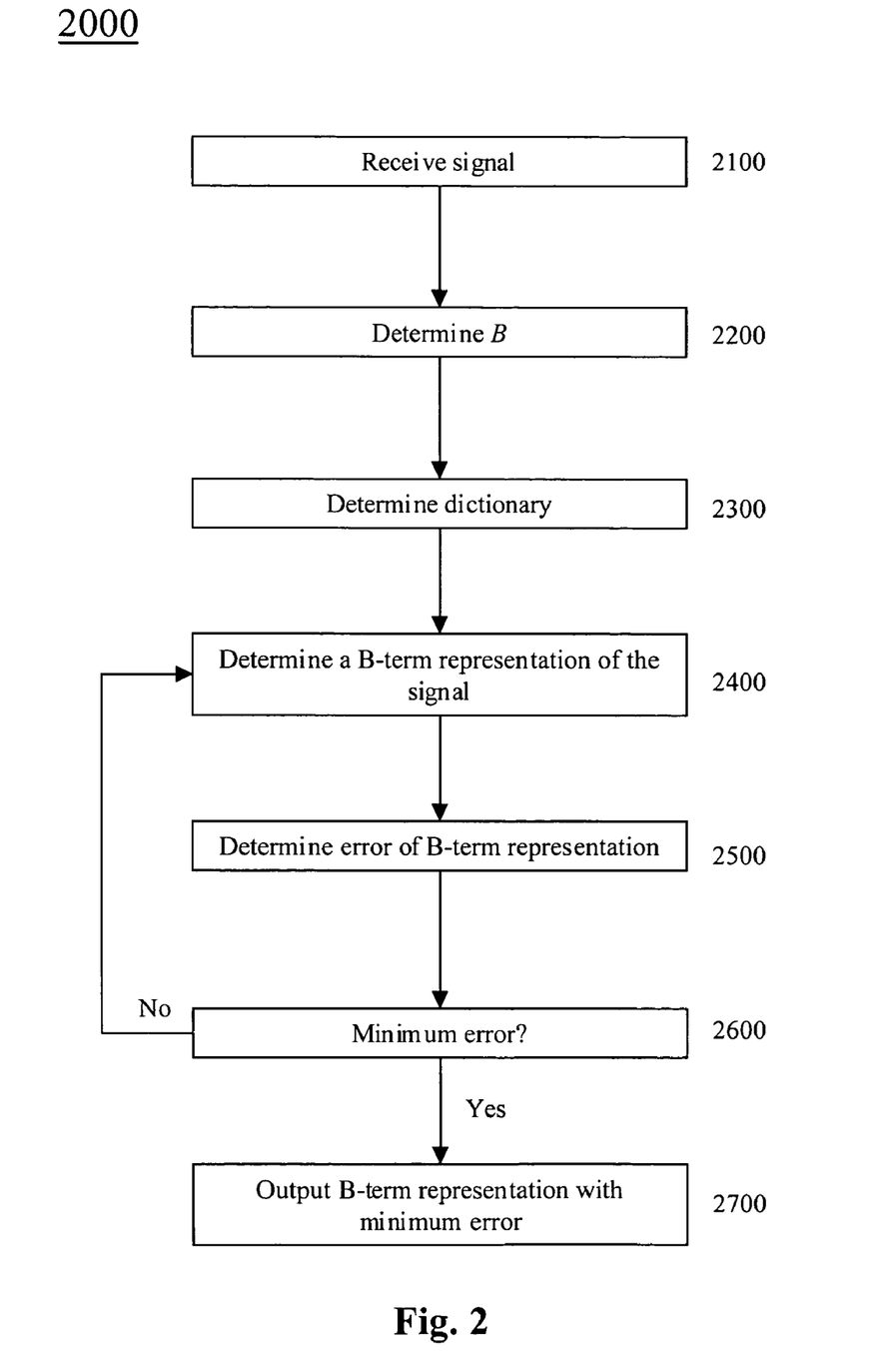
FIG. 2 is a flow diagram of an exemplary embodiment of a method 2000.

FIG. 2 is a flow diagram of an exemplary embodiment of a method 2000 for automatically implementing at least a portion of the nonlinear approximation algorithm described herein. At activity 2100, a signal is received. At activity 2200, a value for B is determined, obtained, and/or received. At activity 2300, a dictionary is determined, obtained, and/or received. At activity 2400, a B-term representation of the signal is determined. At activity 2500, an error for the determined B-term representation is determined. At activity 2600, if the determined error is a minimum compared to the errors and/or likely errors of the other possible B-term representations, then flow proceeds to activity 2700; otherwise, flow returns to activity 2400. At activity 2700, the B-term representation associated with the minimum error, sometimes referred to herein as the "near-optimal B-term representation", is output and/or stored.

In certain exemplary embodiments, the near-optimal B-term representation is determined in a time proportional to N raised to a power of approximately 2, where N is a total number of unit vectors comprised by the predetermined redundant µ-coherent dictionary. In certain exemplary embodiments, the near-optimal B-term representation is determined in $O(N^2)$ time, where N is a total number of unit vectors comprised by the predetermined redundant µ-coherent dictionary.

In certain exemplary embodiments, the near-optimal B-term representation determined without entirely searching the predetermined redundant µ-coherent dictionary.

In certain exemplary embodiments, B is less than $1/(32\mu)$. In certain exemplary embodiments, in $O(B/\epsilon)$ iterations an associated intermediate representation is within an error, denoted $1+\epsilon$, of the near-optimal B-term representation.

In certain exemplary embodiments, any portion of method 2000 can be repeated in any defined manner, including periodically, pseudo-randomly, and randomly. In certain exemplary embodiments, any portion of method 2000 can occur dynamically.

Figure 3:
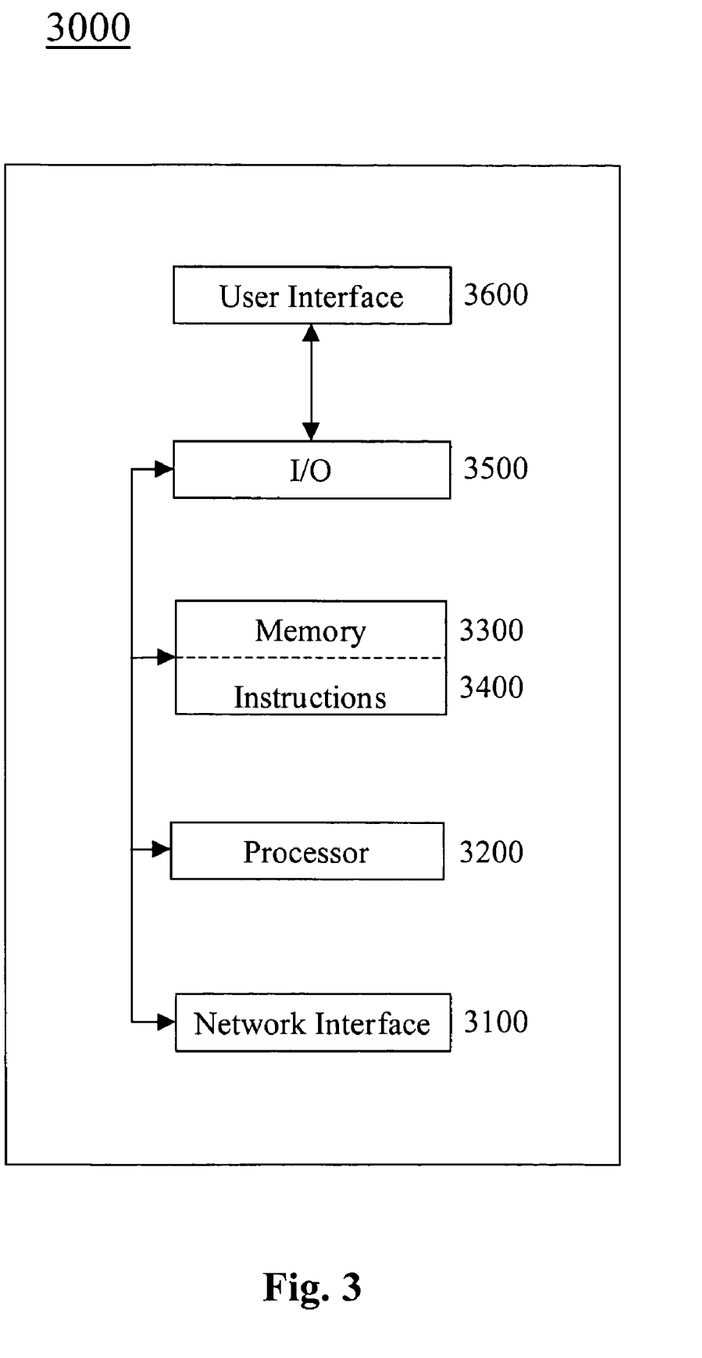
FIG. 3 is a block diagram of an exemplary embodiment of an information device 3000.

FIG. 3 is a block diagram of an exemplary embodiment of an information device 3000, which in certain operative embodiments can represent, for example, signal source 1100, information device 1300, and/or information device 1500 of FIG. 1. Information device 3000 can comprise any of numerous well-known components, such as for example, one or more network interfaces 3100, one or more processors 3200, one or more memories 3300 containing instructions 3400, one or more input/output (I/O) devices 3500, and/or one or more user interfaces 3600 coupled to I/O device 3500, etc.

In certain exemplary embodiments, via one or more user interfaces 3600, such as a graphical user interface, a user can implement, facilitate, monitor, and/or manage an exemplary embodiment of the nonlinear approximation algorithm.

Still other embodiments will become readily apparent to those skilled in this art from reading the above-recited detailed description and drawings of certain exemplary embodiments. It should be understood that numerous variations, modifications, and additional embodiments are possible, and accordingly, all such variations, modifications, and embodiments are to be regarded as being within the spirit and scope of the appended claims. For example, regardless of the content of any portion (e.g., title, field, background, summary, abstract, drawing figure, etc.) of this application, unless clearly specified to the contrary, there is no requirement for the inclusion in any claim of the application of any particular described or illustrated activity or element, any particular sequence of such activities, or any particular interrelationship of such elements. Moreover, any activity can be repeated, any activity can be performed by multiple entities, and/or any element can be duplicated. Further, any activity or element can be excluded, the sequence of activities can vary, and/or the interrelationship of elements can vary. Accordingly, the descriptions and drawings are to be regarded as illustrative in nature, and not as restrictive. Moreover, when any number or range is described herein, unless clearly stated otherwise, that number or range is approximate. When any range is described herein, unless clearly stated otherwise, that range includes all values therein and all subranges therein. Any information in any material (e.g., a United States patent, United States patent application, book, article, etc.) that has been incorporated by reference herein, is only incorporated by reference to the extent that no conflict exists between such information and the other statements and drawings set forth herein. In the event of such conflict, including a conflict that would render a claim invalid, then any such conflicting information in such incorporated by reference material is specifically not incorporated by reference herein.

REFERENCES

The following references are incorporated by reference herein in their entirety:

1. N. Alon, Y. Matias, and M. Szegedy. The space complexity of approximating the frequency moments. JCSS, 58(1):137-147, 1999.
2. Constructive Approximation. On the world wide web at math.vanderbilt.edu/~ca.
3. E. Candes. Ridgelets: Theory and Applications. PhD thesis: Dept. of Statistics, Stanford University, 1998.
4. S. S. B. Chen, D. L. Donoho, and M. A. Saunders. Atomic decomposition by basis pursuit. SIAM J. Sci. Computing, 20:33-61, 1999.
5. R. Coifman and M. V. Wickerhanser. Entropy-based algorithms for best basis selection. IEEE 7Fans. Inform. Theory, 38(2), March 1992.
6. I. Daubechies. Ten lectures on wavelets. SIAM, Philadelphia, 1992.
7. G. Davis S. Mallet and M. Avellaneda. Greedy adaptive approximation. Journal of Constructive Approximation, 13:57-98, 1997.
8. R. A. DeVore. Nonlinear approximation. Acta Numerica, 7:51-150, 1998.
9. R. A. DeVore and G. G. Lorcutz. Constructive Approximation, Springer-Verlag, New York, 1993.
10. D. Donoho. Wedgelets: Nearly-minimax estimation of edges. Annals of Statistics, 27:859-897, 1999.
11. D. L. Donoho and X. Huo. Beamlet pyramids: A new form of multiresolution analysis, suited for extracting lines, curves, and objects from very noisy image data. In Proceedings of SPIE 2000, volume 4119, 2000.
12. A. C. Gilbert, S. Guha, P. Indyk, Y. Kotidis, S. Muthukrishnan, and M. Strauss. Fast, small-space algorithms for approximate histogram maintenance. In Proceedings of ACM STOC 2002-2002.
13. A. C. Gilbert, S. Guha, P. Indyk, S. Muthukrishnan, and M. Strauss. Near-optimal sparse Fourier representations via sampling. In Proc. of ACM STOC, 2002.
14. P. Indyk. High-Dimensional Computational Geometry. PhD thesis, Stanford, 2000.
15. P. Indyk and R. Motwani. Approximate nearest neighbors: Towards removing the curse of dimensionality. In Proceedings of ACM STOC 1998, pages 604-613, 1998.
16. The Journal of Approximation Theory. On the world wide web at math.ohio-state.edu/JAT.
17. E. Kushilevitz, R. Ostrovsky, and Y. Rabani. Efficient search for approximate nearest neighbor in high dimensional spaces. In Proceedings of ACM STOC 1998, pages 614-623, 1998.
18. S. Mallat and Z. Zhang. Matching pursuits with time frequency dictionaries. IEEE Transactions on Signal Proceeding, 41(12):3397-3415, 1993.
19. C. M. Thiele and L. F. Villemoes. A fast algorithm for adapted time frequency tilings. Applied and Computational Harmonic Analysis, 3:91-99, 1996.
20. N. Nisan and A. Wigderson. Hardness vs. randomness. J. Comput. System Sci., 49:149-167, 1994.
21. Y. C. Pati, R. Rezaiifar, and P. S. Krishnaprasad. Orthogonal Matching Pursuit: Recursive Function Approximation with Applications to Wavelet Decomposition. In Proc. of the 27th Annual Asilomar Conference on Signals, Systems, and Computers, pages 40-44, 1993.
22. V. N. Temlyakov. The best m-term approximation and greedy algorithms. Advances in Computational Math., 8:249-265, 1998.
23. V. N. Temlyakov. Greedy algorithms and m-term approximation with regard to redundant dictionaries. J. Approximation Theory, to appear.
24. Lars Villemoes. Best approximation with Walsh atoms. Constructive Approximation, 13:329-355, 1997.
25. Lars Villemoes. Nonlinear approximation with Walsh atoms. In A. Le Méhauté, C. Rabut, and L. L. Schumaker, editors, Surface Fitting and Multiresolution Methods, pages 329-336. Vanderbilt University Press, 1997.

What is claimed is:

1. A method comprising a plurality of activities, comprising:
automatically:
receiving a signal; and
via a plurality of iterations, determining, for the received signal, a provable near-optimal B-term representation formed from a linear combination of a plurality of elements selected from a predetermined redundant µ-coherent dictionary, said determined near-optimal B-term representation corresponding to an error that is a minimum of a set of errors corresponding to all possible B-term representations associated with the predetermined redundant µ-coherent dictionary.

2. The method of claim 1, further comprising:
determining B.

3. The method of claim 1, further comprising:
obtaining B.

4. The method of claim 1, further comprising:
determining the redundant µ-coherent dictionary.

5. The method of claim 1, further comprising:
obtaining the redundant µ-coherent dictionary.

6. The method of claim 1, further comprising:
preprocessing the redundant µ-coherent dictionary.

7. The method of claim 1, further comprising:
determining an error of each iterative B-term representation.

8. The method of claim 1, further comprising:
outputting the determined near-optimal B-term representation.

9. The method of claim 1, wherein the signal is an audio signal.

10. The method of claim 1, wherein the signal is a speech signal.

11. The method of claim 1, wherein the signal is a video signal.

12. The method of claim 1, wherein the near-optimal B-term representation is determined in a time proportional to N raised to a power of approximately 2, where N is a total number of unit vectors comprised by the predetermined redundant µ-coherent dictionary.

13. The method of claim 1, wherein the near-optimal B-term representation is determined in $O(N^2)$ time, where N is a total number of unit vectors comprised by the predetermined redundant µ-coherent dictionary.

14. The method of claim 1, wherein said determining activity is performed without entirely searching the predetermined redundant µ-coherent dictionary.

15. The method of claim 1, wherein B is less than $1/(32\mu)$.

16. The method of claim 1, wherein in $(O(B/\epsilon)$ iterations an associated intermediate representation is within an error, denoted $1+\epsilon$, of the near-optimal B-term representation.

17. A machine-readable medium comprising instructions executable by a processor to perform activities comprising:
automatically:
receiving a signal; and
iteratively determining, for the received signal, a provable near-optimal B-term representation formed from a linear combination of a plurality of elements selected from a predetermined redundant µ-coherent dictionary, said determined near-optimal B-term representation corresponding to an error that is a minimum of a set of errors corresponding to all possible B-term representations associated with the predetermined redundant µ-coherent dictionary.

18. A system comprising:
a signal receiver; and
a signal processor adapted to automatically iteratively determine, for the received signal, a provable near-optimal B-term representation formed from a linear combination of a plurality of elements selected from a predetermined redundant µ-coherent dictionary, said determined near-optimal B-term representation corresponding to an error that is a minimum of a set of errors corresponding to all possible B-term representations associated with the predetermined redundant µ-coherent dictionary.

* * * * *